United States Patent
McCune, Jr.

[11] Patent Number: 6,112,071
[45] Date of Patent: Aug. 29, 2000

[54] QUADRATURE-FREE RF RECEIVER FOR DIRECTLY RECEIVING ANGLE MODULATED SIGNAL

[75] Inventor: Earl W. McCune, Jr., Santa Clara, Calif.

[73] Assignee: Tropian, Inc., Cupertino, Calif.

[21] Appl. No.: 09/027,742

[22] Filed: Feb. 23, 1998

[51] Int. Cl.[7] ............... H04B 1/16; H04B 1/06; H03D 3/00
[52] U.S. Cl. ............ 455/337; 455/236.1; 329/345
[58] Field of Search .............. 455/337, 232.1, 455/234.1, 245.1, 205, 209, 234.2, 226.2; 329/345, 347–349, 317, 316, 315, 321, 350, 360; 375/345, 329

[56] References Cited

U.S. PATENT DOCUMENTS

| | | | |
|---|---|---|---|
| 4,164,623 | 8/1979 | Hilbert et al. | 329/360 |
| 4,653,117 | 3/1987 | Heck | 455/256 |
| 5,289,505 | 2/1994 | LaRosa et al. | 375/329 |
| 5,461,643 | 10/1995 | LaRosa et al. | 375/329 |
| 5,493,713 | 2/1996 | Horsfall et al. | 455/236.1 |

Primary Examiner—Dwayne D. Bost
Assistant Examiner—Tracy M. Legree
Attorney, Agent, or Firm—Burns, Doane, Swecker & Mathis LLP

[57] ABSTRACT

The present invention, generally speaking, provides a quadrature-free RF receiver for directly receiving RF signals such as angle modulated signals. Various embodiments of the receiver use a digital phase detector together with well-known RF components: a limiter, an envelope detector, a slow Automatic Gain Control (AGC) circuit, a fast AGC circuit, etc. Demodulation may be non-coherent or coherent. The approach followed is to handle the underlying non-linearities of the demodulation process within the circuitry itself, rather than relegating the non-linearities to a separate signal processing step as in the prior art. No I and Q signals are obtained, and no coordinate conversions are performed, offering the potential for space savings, increased accuracy, and especially power savings. Depending on the nature of the modulation employed, either circuitry relating to amplitude recovery or circuitry relating to phase recovery may be dispensed with. By comparison, in quadrature systems, at least the mixing step must remain the same regardless of the characteristics of the modulation employed.

18 Claims, 2 Drawing Sheets

QUADRATURE-FREE RF RECEIVER FOR DIRECTLY RECEIVING ANGLE MODULATED SIGNAL

BACKGROUND OF THE INVENTION

1. Field of the Invention

The present invention relates to radio receivers, particularly digital radio receivers.

2. State of the Art

Modulation can be defined as the alteration of some characteristic of a known signal or waveform, i.e., a carrier, as a function of some unknown signal or waveform that conveys information. In radio-frequency (RF) communication systems, the carrier is typically a sinusoid, and there are several methods of modulating the carrier. These include linear modulation, angle modulation, and various types of pulse modulation. Given a sinusoidal carrier described by the equation $A(t)\cos(\omega_c t + \phi(t))$, there are two parameters, the amplitude and the phase angle, that can be varied in accordance with an information signal. Linear modulation results when the amplitude is varied as a linear function of the information signal. Angle modulation includes phase modulation and frequency modulation. If a term is included in the argument of the sinusoidal function that varies in proportion to the information signal, the result is phase modulation. If the argument is such that the difference in the instantaneous frequency and the carrier frequency is proportional to the information signal, the result is frequency modulation.

Demodulation of RF signals has typically involved a quadrature detector having two branches, an I ("in-phase") branch and a Q ("quadrature" or 90° phase-shifted) branch. In the I branch, a received signal is multiplied by the cosine form of the carrier signal and then passed through a low-pass filter. In the Q branch, the received signal is multiplied by the sine form of the carrier signal and pass through a low-pass filter. Quadrature detectors of this type are linear, well-understood, and almost universally used. To obtain the information signal from the I and Q components produced by the respective I and Q branches of the quadrature detector, signal processing is performed. In particular, the phase of the signal may be obtained by taking the inverse tangent of the ratio of Q to I. The amplitude of the signal may be obtained according to the Pythagorean theorem by taking the square root of the sum of the squares of I and Q. These mathematical operations are non-linear.

Two salient observations may therefore be made concerning quadrature detection. First, detection proceeds in two steps, a first mixing step (to obtain I and Q) that is linear and a second signal processing step to which non-linearities are relegated. Second, a coordinate system conversion is first performed and then reversed. That is, the received signal, which may be readily described in polar coordinates in terms of the desired quantities of amplitude and phase, is first converted to rectangular coordinates by projecting the instantaneous signal vector in polar coordinates onto the X (I) and Y (Q) axes, and is then converted back to polar coordinates to obtain amplitude and phase. Such conversions require circuitry that occupies space and consumes power-both of which may be precious commodities, especially in mobile applications such as cellular telephones, pagers, etc. Such conversions may also entail substantial inaccuracies.

What is needed, then, is demodulation techniques that allow for space savings, power savings or increased accuracy to be obtained.

SUMMARY OF THE INVENTION

The present invention, generally speaking, provides a quadrature-free RF receiver for directly receiving RF signals such as angle modulated signals. Various embodiments of the receiver use a digital phase detector together with well-known RF components: a limiter, an envelope detector, a slow Automatic Gain Control (AGC) circuit, a fast AGC circuit, etc. Demodulation may be non-coherent or coherent. The approach followed is to handle the underlying non-linearities of the demodulation process within the circuitry itself, rather than relegating the non-linearities to a separate signal processing step as in the prior art. No I and Q signals are obtained, and no coordinate conversions are performed, offering the potential for space savings, increased accuracy, and especially power savings. Depending on the nature of the modulation employed, either circuitry relating to amplitude recovery or circuitry relating to phase recovery may be dispensed with. By comparison, in quadrature systems, at least the mixing step must remain the same regardless of the characteristics of the modulation employed.

BRIEF DESCRIPTION OF THE DRAWING

The present invention may be further understood from the following description in conjunction with the appended drawing. In the drawing.

DETAILED DESCRIPTION OF THE PREFERRED EMBODIMENTS

Figure 1:
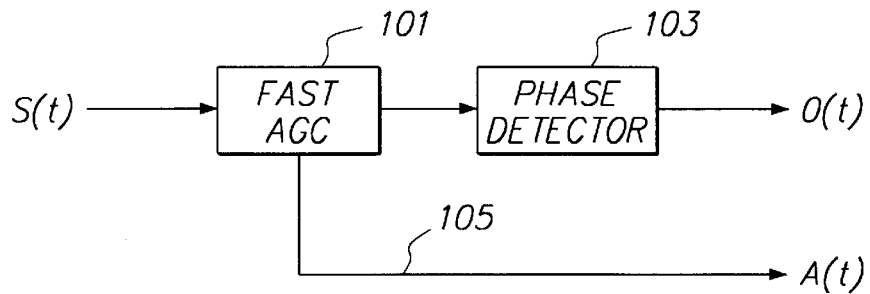
FIG. 1 is a block diagram of a quadrature-free radio receiver in accordance with one embodiment of the invention.

Referring now to FIG. 1, a quadrature-free radio receiver in accordance with a first embodiment of the invention will be described. The receiver uses a phase detector, which may be of a type described in U.S. patent application Ser. No. 09/006,938 (Atty. Dkt. No. 32219-003), entitled DIGITAL PHASE DISCRIMINATION BASED ON FREQUENCY SAMPLING, filed Jan. 14, 1998, incorporated herein by reference.

The foregoing digital phase detector either removes amplitude information from the received signal or assumes a fairly constant-amplitude signal. In the embodiment of FIG. 1, therefore, the digital phase detector 103 is preceded by a fast AGC circuit 101 of a known type. A fast AGC circuit is able to track rapid amplitude variations. Such a circuit is essentially a variable-gain amplifier provided with feedback circuitry to sample the amplitude of the output signal, compare it with a desired amplitude, and control the gain of the amplifier accordingly. The control signal used to control the amplifier is therefore in inverse proportion to the amplitude of the received signal: if the received signal is of high amplitude, the control signal will be small in order to set the gain of the amplifier to a low level; if the received signal is of a low level, the control signal will be large in order to set the gain of the amplifier to a high level. The fast AGC circuit therefore operates to recover amplitude information, and the control signal 105 containing the amplitude information is output to a subsequent processing step. The subsequent processing step may be a signal processing step, much simplified as compared to that of the typical quadrature detector. The phase detector 103 recovers phase information directly from the constant-amplitude output signal of the fast AGC circuit 101.

Notice that the receiver of FIG. 1 consists essentially of two blocks, one (101) for amplitude and one (103) for phase. These quantities are obtained directly in a quadrature-free manner, i.e., without IQ processing.

Figure 2:
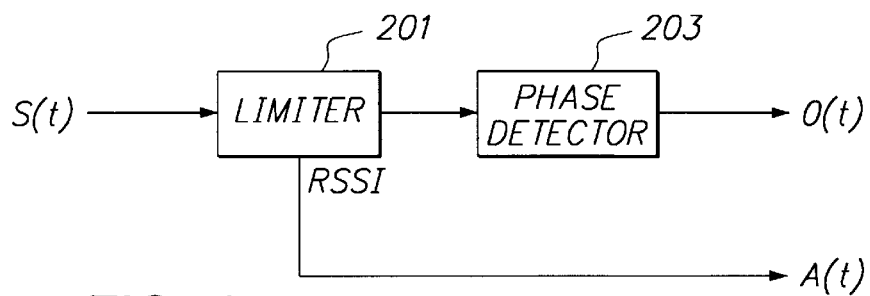
FIG. 2 is a block diagram of a quadrature-free radio receiver in accordance with another embodiment of the invention.

Referring to FIG. 2, a similar effect may be achieved by substituting for the fast AGC circuit of FIG. 1 a limiter 201 of a known type. Such limiters are used, for example, in AMPS cellular telephones, consist primarily of a saturating amplifier that amplifies the input signal to a fixed, predetermined level. The limiter also produces an RSSI (Received Signal Strength Indicator) signal indicative of the amplitude of the received signal. The RSSI signal is not strictly proportional to the received signal but is a monotonic function of the strength of the received signal (typically the logarithm of the amplitude of the received signal), from which the actual amplitude may be computed. As in FIG. 1, the limiter of FIG. 2 is followed by a phase detector that recovers phase information directly.

Figure 3:
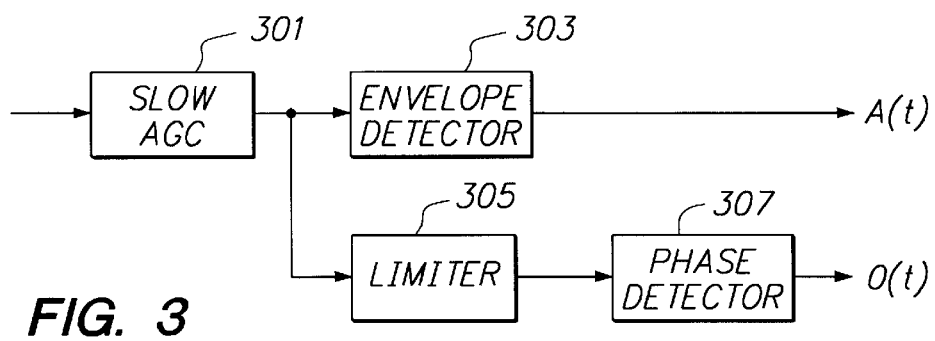
FIG. 3 is a block diagram of a quadrature-free radio receiver in accordance with another embodiment of the invention.
Figure 4:
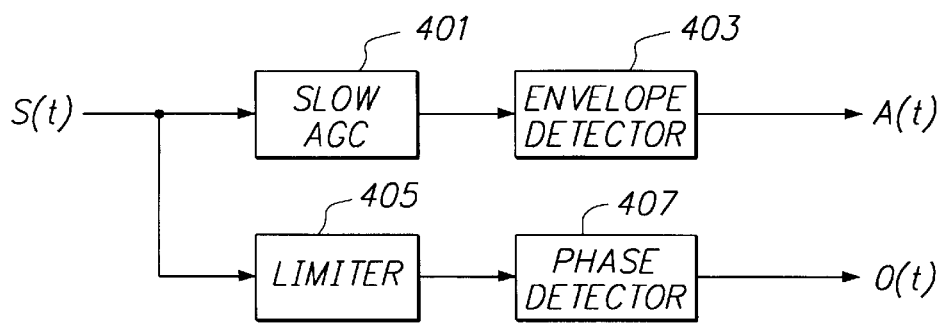
FIG. 4 is a block diagram of a quadrature-free radio receiver in accordance with another embodiment of the invention.

The series combination of a limiter and a phase detector as shown in FIG. 2 proves to be a very useful combination and is used in other embodiments of the radio receiver. Referring to FIG. 3, the combination of limiter 305 and phase detector 307 is used in conjunction with what is essentially an AM radio receiver—a slow AGC circuit 301 of a known type followed by an envelope detector 303 of a known type. The envelope detector recovers the amplitude information. In the example of FIG. 3, the limiter/phase detector combination receives as its input signal the output signal of the slow AGC circuit. The limiter/phase detector combination could just as easily receive as it input signal the received signal itself, as shown in FIG. 4. Operation does not differ appreciably whether the input signal to the limiter/phase detector combination is the received signal itself or the output signal of the slow AGC circuit, because of the high gain of the limiting amplifier.

Figure 5:
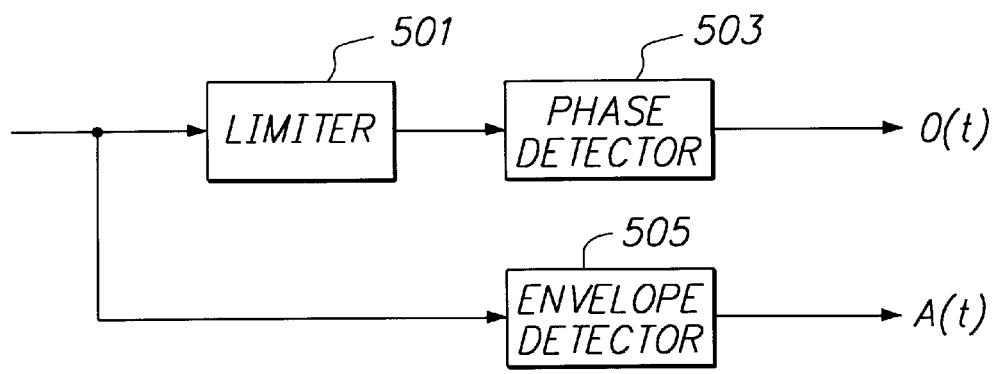
FIG. 5 is a block diagram of a quadrature-free radio receiver in accordance with another embodiment of the invention.

The radio receivers of FIG. 3 and FIG. 4 assume an open field radio propagation environment, i.e., wireless transmission. In the case of wired transmission, e.g., cable television transmission, the slow AGC circuit may be dispensed with. There results the radio receiver of FIG. 5.

All of the radio receivers described thus far use non-coherent demodulation. Coherent demodulation may also be used. In coherent modulation, phase information is used to help recover amplitude information. More particularly, the received signal is multiplied by a replica of the received signal having the amplitude modulation removed. The multiplied signal is then low-pass filtered.

Figure 6:
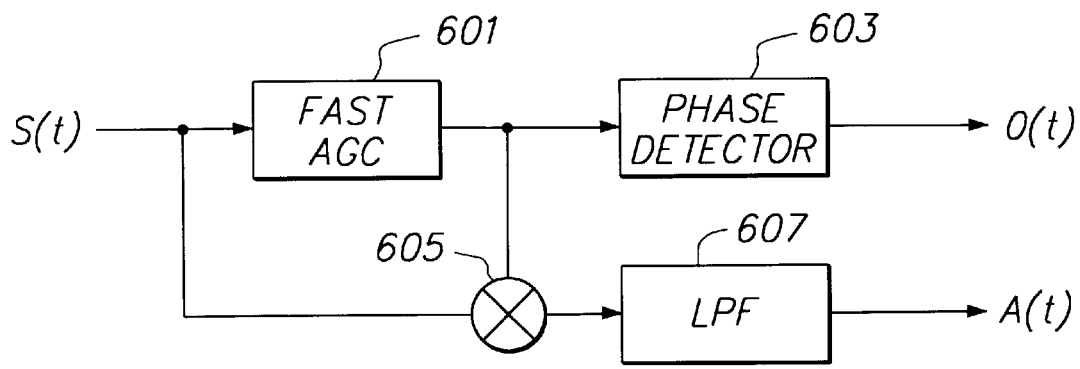
FIG. 6 is a block diagram of a quadrature-free radio receiver in accordance with another embodiment of the invention.
Figure 7:
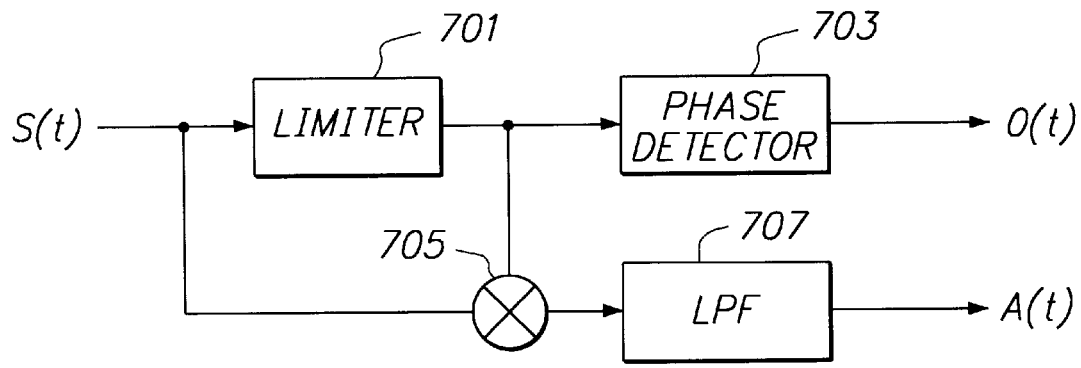
FIG. 7 is a block diagram of a quadrature-free radio receiver in accordance with another embodiment of the invention.

The coherent demodulators of FIG. 6 and FIG. 7, respectively, correspond generally to the non-coherent demodulators of FIG. 1 and FIG. 2. Referring to FIG. 6, the received signal is input to the serial combination of a fast AGC circuit and a phase detector (601, 603). The phase detector 603 recovers the phase information. The input and output signals of the fast AGC circuit 601 are input to a multiplier 605, the output signal of which is low-pass filtered (607) to obtain the amplitude information.

The demodulator of FIG. 7 is like that of FIG. 6 with the exception that a limiter circuit 701 is substituted for the AGC circuit of FIG. 6.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed is:

1. A demodulator for demodulating an RF signal without IQ processing, comprising:
    a first signal path for recovering phase information contained in the RF signal, comprising:
        amplitude influencing circuitry responsive to the RF signal for producing an output signal having amplitude variations at least partially removed; and
        a phase detector responsive to the output signal of the amplitude influencing circuitry for recovering phase information contained in the RF signal and outputting a phase signal; and
    a second signal path for recovering amplitude information contained in the RF signal and outputting an amplitude signal.

2. The apparatus of claim 1, wherein said amplitude influencing circuitry outputs an amplitude signal indicative of the amplitude of the RF signal.

3. The apparatus of claim 2, wherein said amplitude influencing circuitry is a fast AGC circuit.

4. The apparatus of claim 2, wherein said amplitude influencing circuitry is a limiter, and the amplitude signal indicative of the amplitude of the RF signal is an RSSI signal.

5. The apparatus of claim 1, further comprising an envelope detector responsive to the RF signal for producing an amplitude signal indicative of the amplitude of the RF signal.

6. The apparatus of claim 1, further comprising circuitry responsive to the RF signal and to said output signal having amplitude variations at least partially removed for removing phase information from the RF signal and producing a corresponding output signal.

7. The apparatus of claim 6, wherein said circuitry for removing phase information is a mixer.

8. The apparatus of claim 7, wherein said amplitude influencing circuitry is a fast AGC circuit.

9. The apparatus of claim 8, further comprising a low pass filter, coupled to the output signal of said mixer, that produces an amplitude signal indicative of the amplitude of the RF signal.

10. The apparatus of claim 7, wherein said amplitude influencing circuitry is a limiter circuit.

11. The apparatus of claim 10, further comprising a low pass filter, coupled to the output signal of said mixer, that produces an amplitude signal indicative of the amplitude of the RF signal.

12. A demodulator for demodulating an RF signal without IQ processing, comprising:
    a first signal path for recovering phase information contained in the RF signal, comprising:
        first amplitude influencing circuitry responsive to the RF signal for producing a first output signal having amplitude variations at least partially removed; and
        a phase detector responsive to the first output signal of the amplitude influencing circuitry for recovering phase information contained in the RF signal and outputting a phase signal; and
    a second signal path for recovering amplitude information contained in the RF signal and outputting an amplitude signal.

13. The apparatus of claim 12, wherein said amplitude influencing circuitry is a limiter.

14. The apparatus of claim 13, further comprising second amplitude influencing circuitry responsive to the RF signal for producing a second output signal having amplitude variations at least partially removed.

15. The apparatus of claim 14, wherein said second amplitude influencing circuitry is a slow AGC circuit.

16. The apparatus of claim 15, further comprising an envelope detector responsive to said second output signal for producing an amplitude signal indicative of the amplitude of the RF signal.

17. The apparatus of claim 16, wherein said first amplitude influencing circuitry is coupled directly to the RF signal.

18. The apparatus of claim 16, wherein said first amplitude influencing circuitry is coupled to the RF signal indirectly through the second amplitude influencing circuitry.

* * * * *